(12) United States Patent
Palata et al.

(10) Patent No.: US 6,225,710 B1
(45) Date of Patent: May 1, 2001

(54) PROCESS FOR OPERATING A CAPACITIVE SWITCH AND A CIRCUIT OF A CAPACITIVE SWITCH

(75) Inventors: Jaromir Palata, Friedrichshafen (DE); Jörg Schulz, Lustenau (AT)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 09/275,869

(22) Filed: Mar. 25, 1999

(30) Foreign Application Priority Data

Mar. 25, 1998 (DE) ................................ 198 13 013

(51) Int. Cl.⁷ ........................................ H02M 3/00
(52) U.S. Cl. ........................ 307/109; 307/125; 307/129
(58) Field of Search ............................. 307/109, 129, 307/125; 324/671; 340/815.62; 345/174; 73/861.06

(56) References Cited

U.S. PATENT DOCUMENTS 4,604,904 * 8/1986 Massen ........................... 73/861.06

5,880,538 * 3/1999 Schulz ................................ 307/109

* cited by examiner

*Primary Examiner*—Stephen W. Jackson
*Assistant Examiner*—Sharon Polk
(74) *Attorney, Agent, or Firm*—Nixon Peabody LLP; David S. Safran

(57) ABSTRACT

A capacitive switch is presented including an oscillator, with a gauge length and an evaluation circuit. The oscillator delivers a measurement signal and the gauge length has at least one sensor with a sending electrode and a measurement electrode. The switch has a low noise emission and is especially invulnerable to incident noise due to the fact that there is a noise source and two correlators. In the first correlator, frequency-spreading of the measurement signal takes place. The frequency-spreading measurement signal is connected to the second input of the second correlator and to the sending electrode. The measurement electrode is connected to the first input of the second correlator.

20 Claims, 11 Drawing Sheets

PROCESS FOR OPERATING A CAPACITIVE SWITCH AND A CIRCUIT OF A CAPACITIVE SWITCH

BACKGROUND OF THE INVENTION

1. Field of the Invention

The invention relates to a process for operating a capacitive switch, the switch having an oscillator which delivers a measurement signal, a capacitive sensor consisting of at least one sending electrode and one measurement electrode, and an evaluation circuit. In addition, the invention relates to the circuit of a capacitive switch, with an oscillator, with a gauge length and an evaluation circuit, the oscillator delivering a measurement signal and the gauge length having at least one sensor with a sending electrode and a measurement electrode.

2. Description of the Related Art

Switches, especially inductive and capacitive switches, are used in a host of very different applications in industrial engineering. They can be both switches which operate without contact, i.e. those in which the actuation object simply approaches the active surface of the switch, which are then usually called proximity switches, and also contact switches, i.e. those in which the actuation object touches the active surface of the switch. It is common to these switches that they are so-called open electronic systems, i.e. the active sensors are not entirely shielded and thus release electromagnetic radiation and signals into their vicinity and vice versa pick up electromagnetic radiation and signals from the vicinity. This circumstance can on the one hand lead to noise emissions of the switch, on the other hand to incident noise into the switch.

The aforementioned problem has been addressed in switches by on the one hand the active sensors being at least partially shielded, on the other hand by the voltage on the sensors being reduced. The two however lead automatically to a lower maximum possible object acquisition distance—generally called the operating distance—and/or to a poorer ratio of the useful signal to the noise signal.

Due to the increasing popularity of devices which emit electromagnetic radiation and signals, such as mobile telephones or remote controls, and due to increased use of switches also in the vicinity of these electromagnetic signal-emitting devices, malfunctions of switches and/or electronic devices by noise emissions and incident noise can occur to an increasing degree. One example is the use of capacitive switches in the door handles of motor vehicles, which on the one hand are disrupted by the emitted signals of a car phone and on the other hand can interfere with the car phone itself.

SUMMARY OF THE INVENTION

Thus the object of this invention is to make available a process for operating a switch or a circuit of a switch in which noise emission or sensitivity to incident noise is reduced.

The aforementioned object is achieved according to a first teaching of the invention in the initially described process by the measurement signal being frequency-spread by a noise signal delivered by a noise source, by the frequency-spread measurement signal on the one hand being sent preferably via a matching network to the first input of a correlator and on the other being emitted by the sending electrode of the capacitive sensor, by the received signal picked up by the measurement electrode of the sensor being sent to the second input of the correlator and by the output signal of the correlator being sent to the evaluation circuit. According to a second teaching of the invention the aforementioned object in the initially described process is achieved by a second oscillator generating an auxiliary signal which has the same or a slightly different frequency from the measurement signal, by the measurement signal and the auxiliary signal being frequency spread by a noise signal delivered by the noise source, by the frequency-spread measurement signal being emitted by the sending electrode of the capacitive sensor, by the frequency spread auxiliary signal—preferably via a matching network—being sent to the first input of a correlator, by the received signal picked up by the measurement electrode of the sensor being sent to the second input of the correlator and by the output signal of the correlator being sent to the evaluation circuit.

The frequency spreading of the measurement signal which takes place by means of a noise signal according to both the first and second teaching of the invention increases the bandwidth and thus reduces the spectral energy density of the measurement signal without the need to reduce the voltage on the sensor. In this way, on the one hand the amplitude of the emitted noise signals is reduced, on the other hand the maximum allowable amplitude of a noise signal emitted into the switch is increased. Thus both the interference of the switch with other devices and also the sensitivity of the switch to noise by other devices are reduced.

It is therefore critical for the teaching of the invention that the measurement signal not be of a single frequency or be narrowband, but that it be located within a broadband frequency spectrum.

According to a first advantageous embodiment of both the first and second teaching of the invention the frequency spreading of the measurement signal or the auxiliary signal is produced by frequency modulation of the measurement signal or the auxiliary signal with the noise signal. For frequency modulation a transistor is advantageously used which is used at the same time as a noise amplifier. In this process it is especially advantageous that only very few components are needed and overall power consumption is very low. This process is especially suited for noncritical sensor applications, i.e. in those sensors which do not require a large operating distance. One possible application of this process is use in a capacitive motor vehicle door handle in which it is important that the switch consumes only very little power so that the battery is not discharged when the motor vehicle is idle for a longer time.

According to one alternative advantageous embodiment of the process according to the first or the second teaching of the invention the frequency spreading of the measurement signal or the auxiliary signal is produced by phase shift keying of the measurement signal or the auxiliary signal. In phase shift keying which takes place preferably using a binary random signal obtained from the noise signal, very high noise immunity can be achieved by 0/180° phase shift keying. In this process then a correlation is possible when a permanent electrical connection between the transmitter and the receiver is not possible or not wanted. In this case the correlation code would then have to be stored and transmitted.

Within the framework of the invention a measurement signal as such can be abandoned, therefore the noise signal can be used as the measurement signal. Then of course it is not possible using the second correlator from the broadband receive signal to generate one which is of a single frequency or which is narrowband.

The object of the invention in the initially mentioned circuit of a switch is achieved in that there are a noise source and two correlators, that in the first correlator frequency spreading of the measurement signal takes place by a noise source, that the frequency-spread measurement signal on the one hand is connected to the first input of the second correlator and on the other to the sending electrode and that the measurement electrode is connected to the second input of the second correlator. With this circuit the process according to the first teaching of the invention can be used to special advantage. The circuit is thus made especially simple and power-saving by using the emitter diode of a transistor as the noise source in breakdown operation. In the sense of a circuit which requires only a few parts it is advantageous if as the first correlator there is a second transistor which is used both as a noise amplifier and which also accomplishes frequency modulation of the measurement signal with the noise signal.

A correlator in the sense of this patent application is defined as an electronic component with which averaging of products (correlation) is done. Here the product consists of the multiplicative linking of several input signals which can be of an analog or binary nature. Averaging is done by integration of several multiplication processes which succeed each other in time either with time quantization or by continuing integration without time quantization. Depending on the type of input signals and averaging, different types of correlators are distinguished. In a multiplication correlator two analog electrical input signals are processed with one another without time or amplitude quantization. In a relay correlator one analog and one binary electrical input signal are processed with one another. This relay correlator can for example be a ring mixer. A polarity correlator is defined as a correlator which processes two or more binary electrical signals with one another. One such polarity correlator can for example be an inverter, especially an EX-OR gate or a flip-flop.

A circuit which is especially suited for executing the process according to the second teaching of the invention is characterized in that there is a second oscillator which produces an auxiliary signal and there are two inverters, that one input of the two inverters at a time is connected to the noise source and the other input to the measurement signal or the auxiliary signal and that the output of the first inverter is connected to the sending electrode and the output of the second inverter is connected to the first input of the second correlator.

A rectangular oscillator which can be built very easily with a crystal and a HCMOS gate is especially suitable as the oscillator. A ceramic oscillator can also be used. These types of oscillators are very economical and in addition are relatively temperature-stable and frequency-stable.

In particular there are a host of possibilities for configuring and developing the process as claimed in the invention or the circuit as claimed in the invention. In this respect reference is made both to patent claims subordinate to claims 1, 2, and 10 and also to the description of the preferred embodiments of the circuit as claimed in the invention shown in the drawings.

BRIEF DESCRIPTION OF THE DRAWINGS

FIG. 5 shows a diagram of a circuit as claimed in the invention similar to the circuit as shown in FIG. 2a;

DETAILED DESCRIPTION OF THE INVENTION

Figure 1:
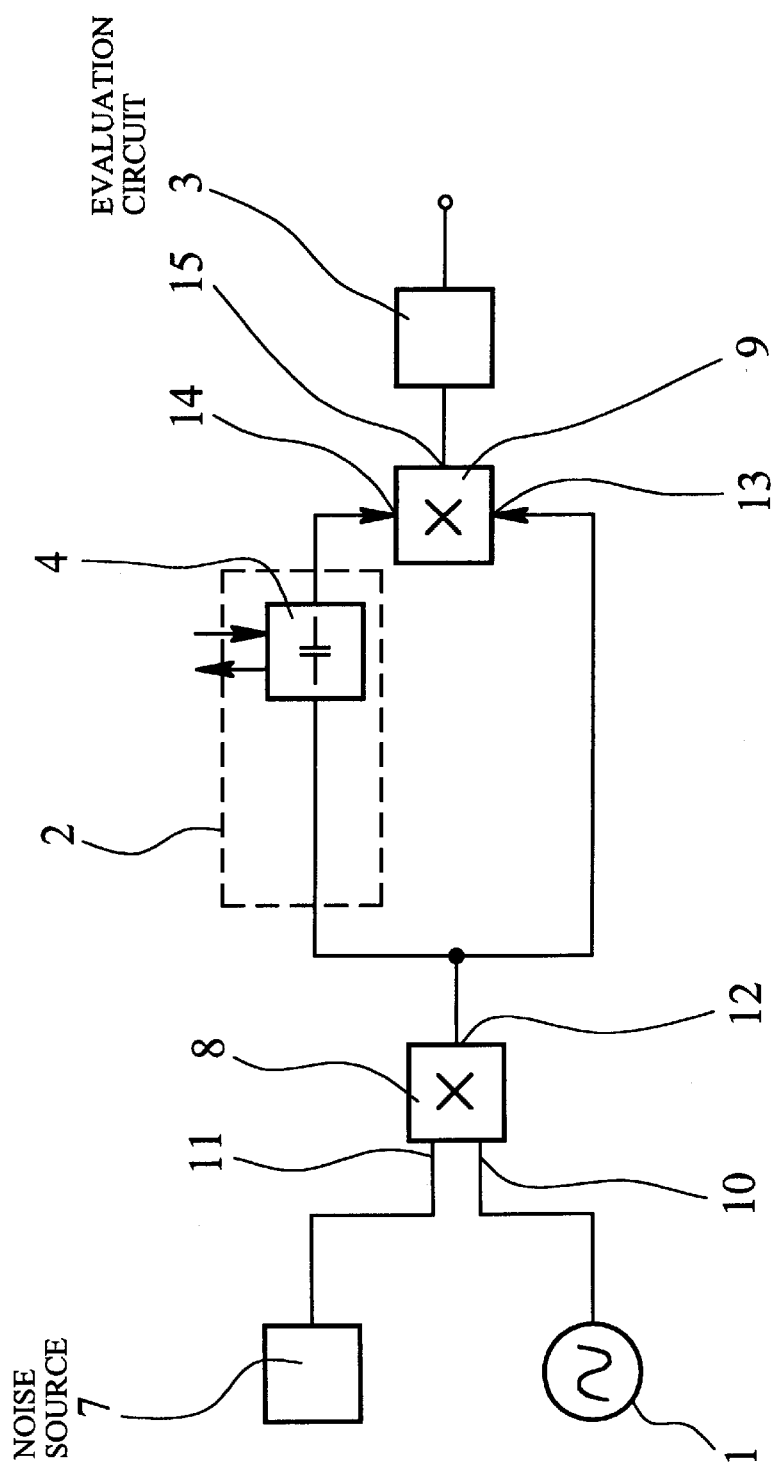
FIG. 1 shows a diagram of a first embodiment of a circuit as claimed in the invention.
Figure 2A:
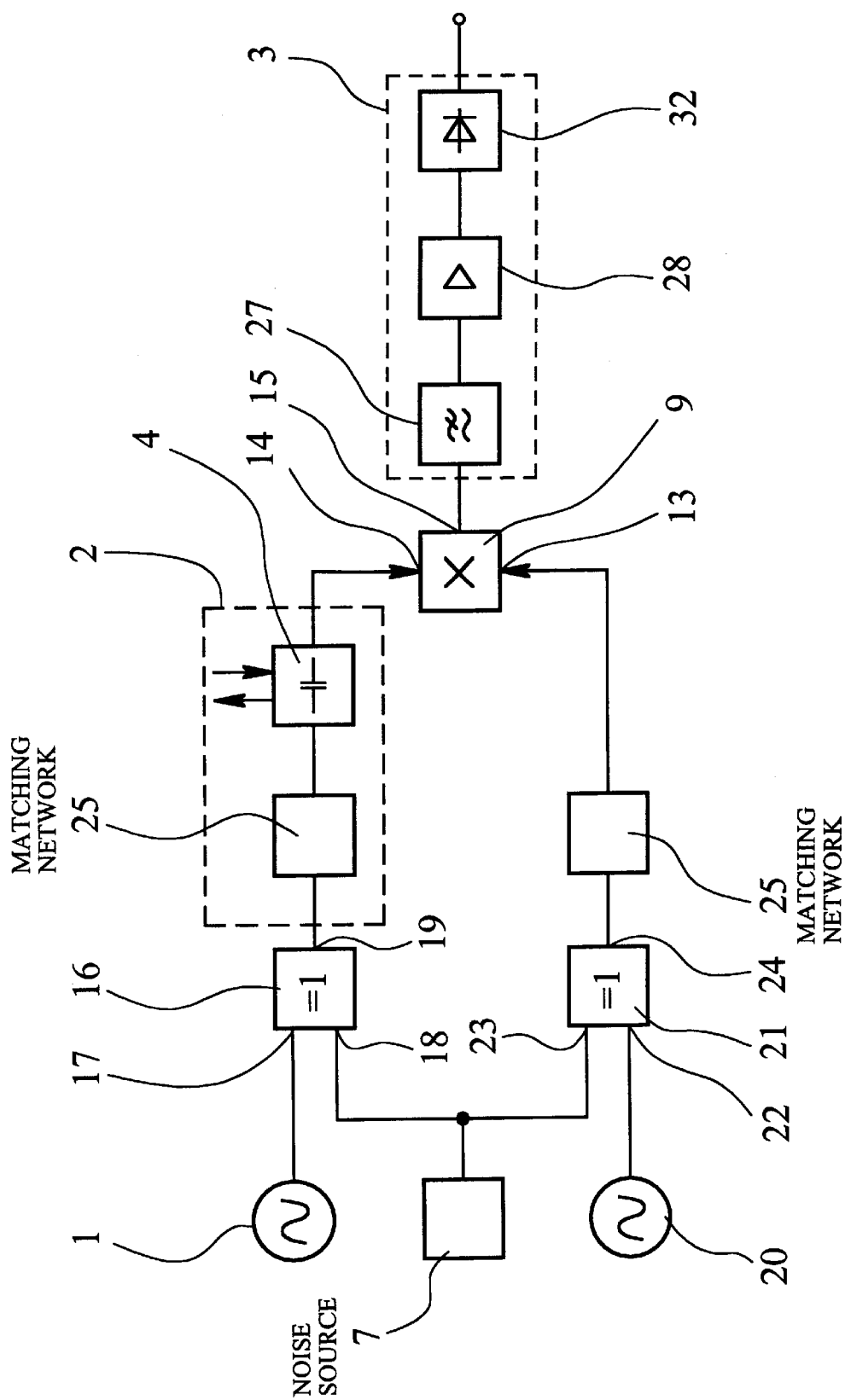
FIGS. 2a and 2b show two diagrams of a two embodiments of the circuit as claimed in the invention.
Figure 2B:
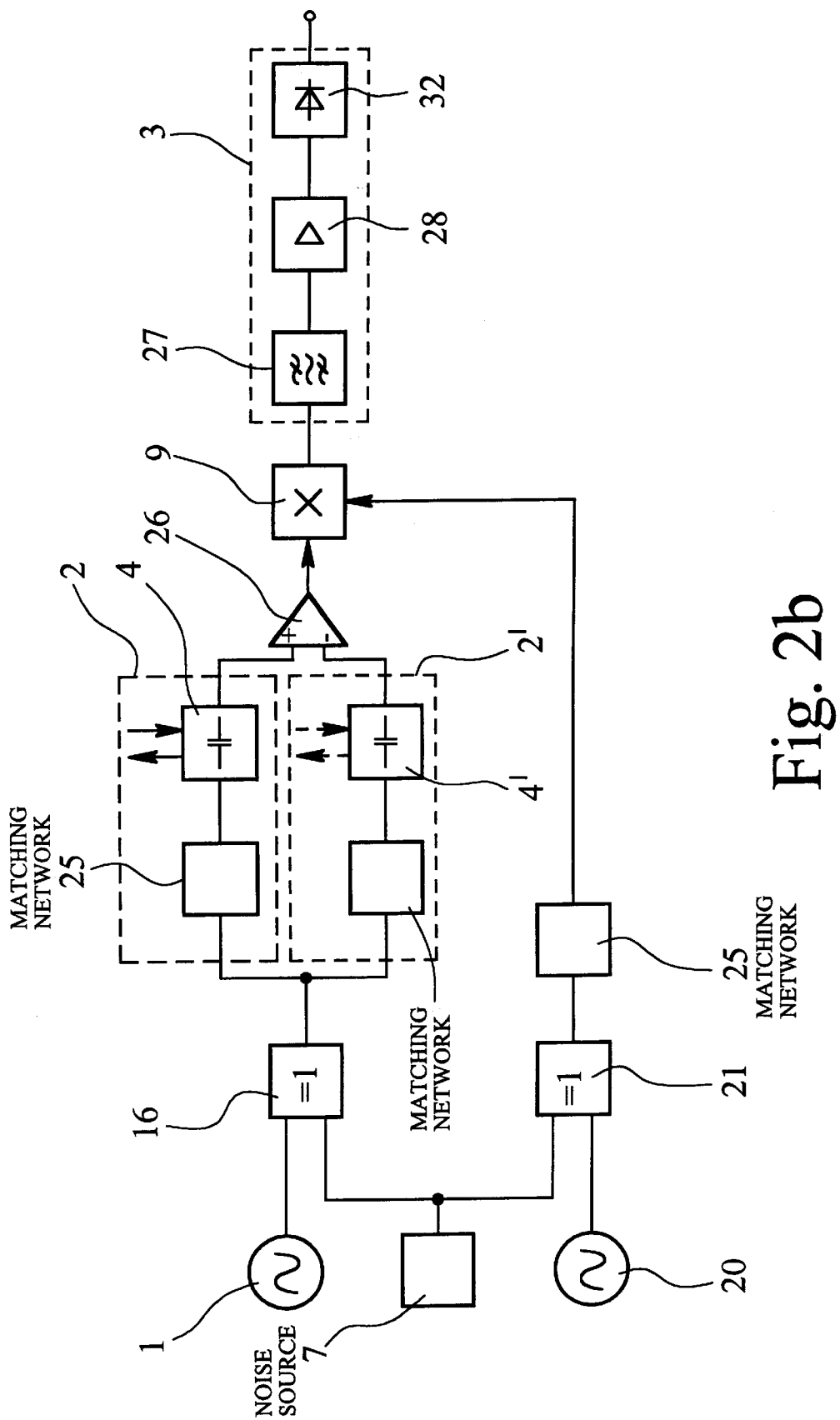
Figure 3:
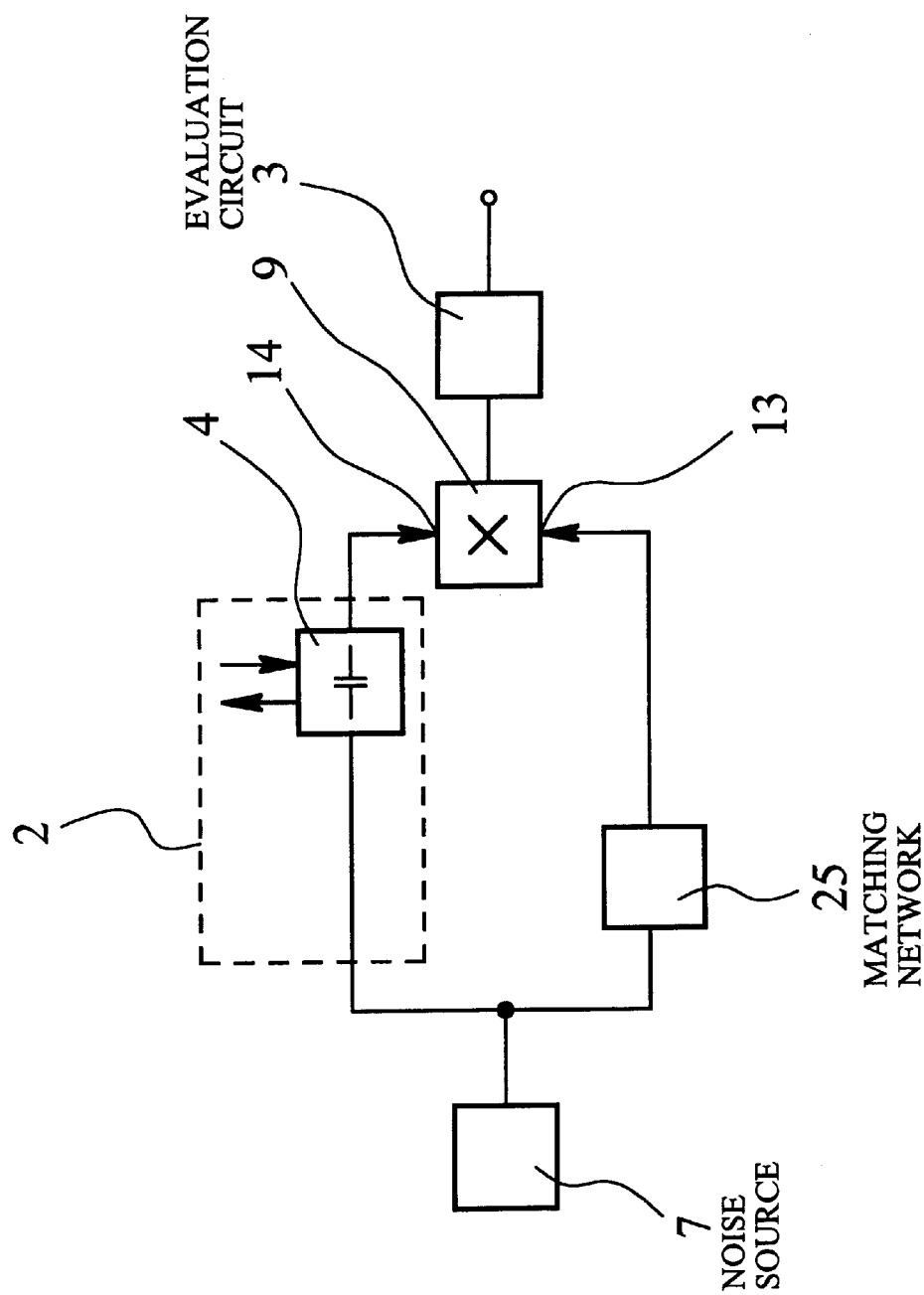
FIG. 3 shows a diagram of one especially simple embodiment of a circuit as claimed in the invention.

FIGS. 1 to 3 show different embodiments of the circuits of a switch as claimed in the invention which all have firstly an oscillator 1, a gauge length 2 and an evaluation circuit 3. The gauge length 2 contains a sensor 4 which is always illustrated here as a capacitive sensor. The sensor 4 emits electromagnetic signals into its environment and conversely picks up electromagnetic signals from the environment, which is shown by the arrows, and consists of a sending electrode 5 and a measurement electrode 6, as is shown in FIG. 6, but can moreover have still for example a ground electrode.

The circuit as shown in FIG. 1 as claimed in the invention has a noise source 7 and two correlators 8 and 9. The oscillator 1 is connected to the first input 10 and the noise source 7 to the second input 11 of the correlator 8. In the first correlator 8 frequency spreading of the measurement signal delivered by the oscillator 1 takes place. The output 12 of the correlator 8 is connected both to the sensor 4 as well as to the first input 13 of the second correlator 9. The second input 14 of the second correlator 9 is connected to the measurement electrode 6 of the sensor 4. The frequency spread measurement signal is thus on the one hand sent to the sending electrode 5, on the other directly to the second correlator 9. At the output 15 of the second correlator 9 an unspread signal is obtained which is sent for further processing of the evaluation circuit 3.

In contrast to the circuit as shown in FIG. 1, in the circuit as shown in FIGS. 2a, 2b, 4 and 5 the first correlator is made as an inverter 16. From the inverter 16 the first input 17 is connected to the oscillator 1 and the second input 18 is connected to the noise source 7. Otherwise the circuit as shown in FIGS. 2a and 2b has a second oscillator 20 which generates an auxiliary signal. The auxiliary signal can have either the same frequency as the measurement signal or advantageously can have a frequency slightly different from the measurement signal. The auxiliary signal of the oscillator 20 is frequency spread by a second inverter 21 in exactly the same way by the noise signal as the measurement signal is frequency spread by the inverter 16. To do this the oscillator 20 is connected to the first input 22 of the second inverter 21 and the noise source 7 is connected to the second input 23 of the inverter 21. Of course, instead of the second inverter 21 another suitable correlator can be used.

The frequency spread auxiliary signal is sent from the output 24 of the inverter 21 via a matching network 25 to the first input 13 of the second correlator 9, while the frequency-spread measurement signal from the output 19 of the inverter 16 is sent to the sending electrode 5 of the sensor 4 and the received signal received by the measurement electrode 6 of the sensor 4 is sent to the second input 14 of the correlator 9. At the output 15 of the second correlator 9 there is an uncorrelated received signal with an intermediate frequency which corresponds to the frequency difference of the measurement signal from the auxiliary signal.

The gauge length 2 contains in addition to the sensor 4 another matching network 25, the matching network 25 generally being a passive electrical module, consisting of resistors and capacitors. Frequency response and transit time matching of the two signals arriving at the second correlator 9 is done by the two matching networks 25.

The circuit shown in FIG. 2b differs from the one shown in FIG. 2a in that a second essentially identical gauge length 2' is connected parallel to the gauge length 2. The second gauge length 2' can contain either a second active sensor 4' or can be used simply as the reference measurement channel, for example for compensation of temperature drift. The gauge lengths 2 and 2' are sent to a difference measurement amplifier 26 with an output connected to the input 14 of the second correlator 9.

FIG. 3 shows one alternative of a circuit with very few components in which as the measurement signal the noise signal of a noise source 7 is directly used so that a separate oscillator is unnecessary. The noise signal is on the one hand routed via the gauge length 2 consisting of the sensor 4, on the other hand via a matching network 25 to the first input 13 of the second correlator 9. One such circuit certainly has the advantage of a very wide frequency spectrum, but generally for operation of a sensor a narrowband measurement signal is necessary, for which reason generally at least one oscillator is used, as is shown in the other figures.

Figure 4:
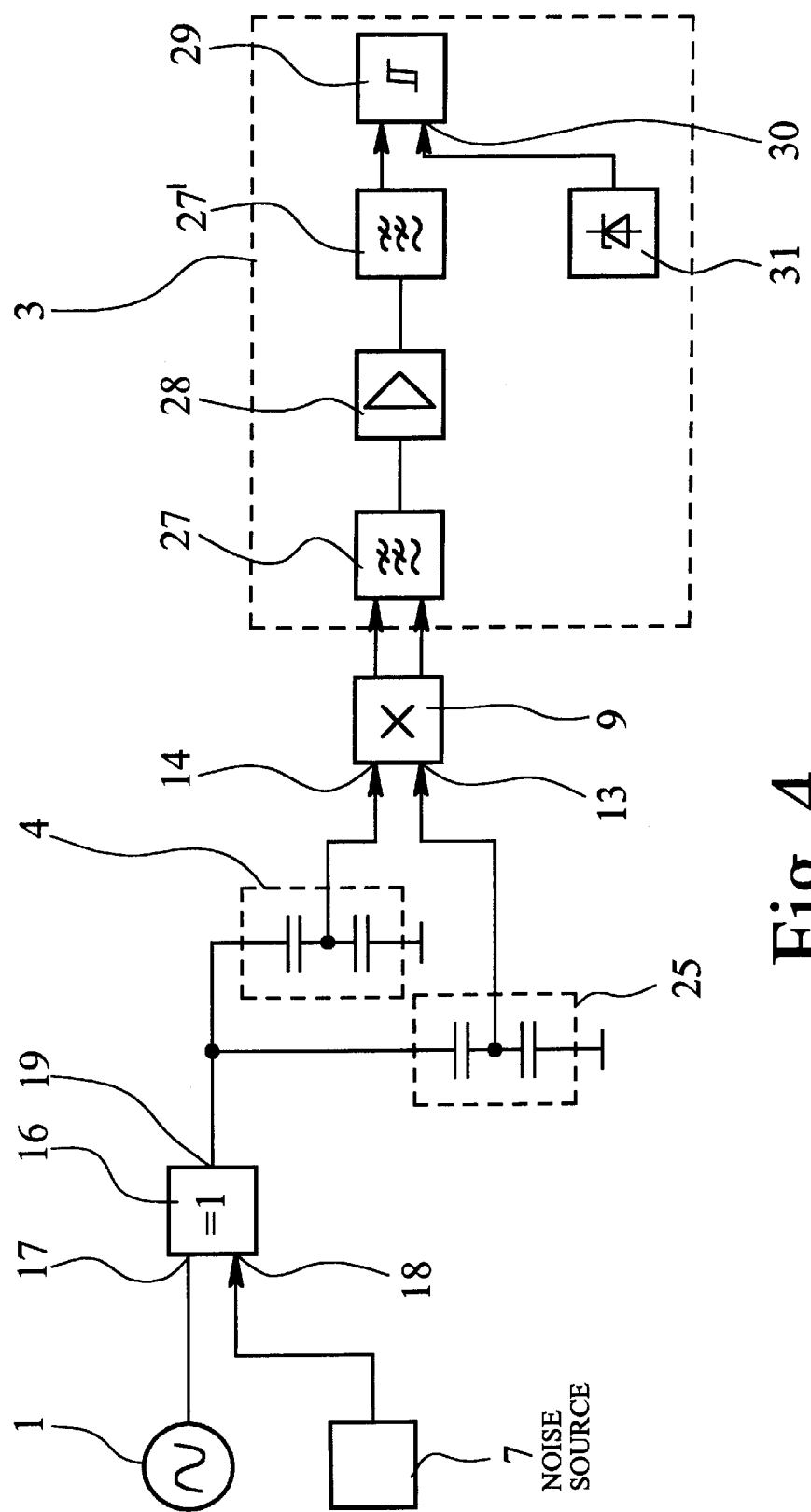
FIG. 4 shows a diagram of a circuit as claimed in the invention similar to the circuit as shown in FIG. 1.

FIG. 4 shows a circuit which corresponds essentially to the circuit from FIG. 1. The first correlator is in turn made as an inverter 16, and the matching network corresponds essentially to the sensor 4 so that the matching network 25 assumes the function of a reference measurement channel. In contrast to the sensor 4 however the matching network 25 is not active to the outside, i.e. it is not influenced by an actuation object. The second correlator 9 is advantageously a 4-quadrant multiplier or a multiplexer with a DC voltage signal at its output which first traverses a filter 27 is followed by an amplifier 28 and a second filter 27'. Then the signal is sent to a voltage comparator 29 with hysteresis, with a Zener diode 31 which delivers a reference voltage connected its second input 30.

Figure 5:
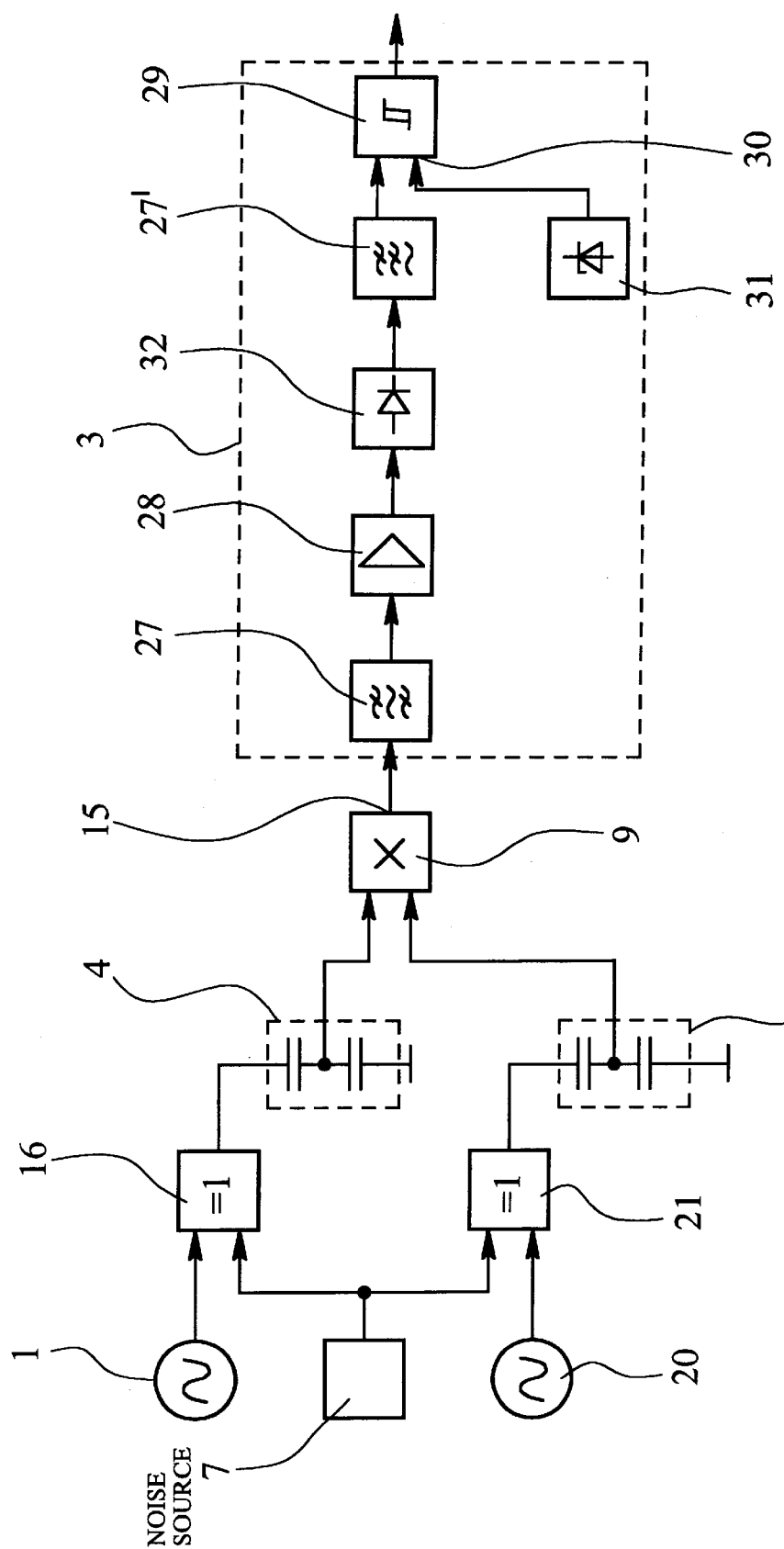

In contrast to the circuit as shown in FIG. 4, the circuit as shown in FIG. 5 has a second oscillator 20 and a second inverter 21. The circuit as shown in FIG. 5 corresponds essentially to the circuit shown in FIG. 2a. The measurement signal delivered by the oscillator 1 and the auxiliary signal delivered by the oscillator 20 at the output 15 of the second correlator 9 which can be made for example as a ring mixer lead to an AC voltage signal with a frequency which corresponds to the frequency difference of the measurement signal from the auxiliary signal. This signal which is designated the intermediate frequency is first filtered by a filter 27 and then sent to an amplifier 28.

The frequency of the measurement signal and the auxiliary signal is preferably in the frequency range from 1 to 10 MHz, since at lower frequencies the sensitivity of the sensor is too low. The frequency difference between the measurement signal and the auxiliary signal is chosen to be relatively small. Advantageously the frequency difference is a few hundred kHz or less. The advantage of a low to medium intermediate frequency is that simple and thus economical filters can be used which do not require balancing. For example active filters or ceramic filters can be used.

The evaluation circuit 3 in the circuit as shown in FIG. 5 includes besides the first filter 27 and the amplifier 28 a second filter 27' and a rectifier 32. The rectifier 32 is connected behind the amplifier 28 and in front of the second filter 27' which is followed by a voltage comparator 29 with hysteresis, as in the circuit as shown in FIG. 4.

Figure 6A:
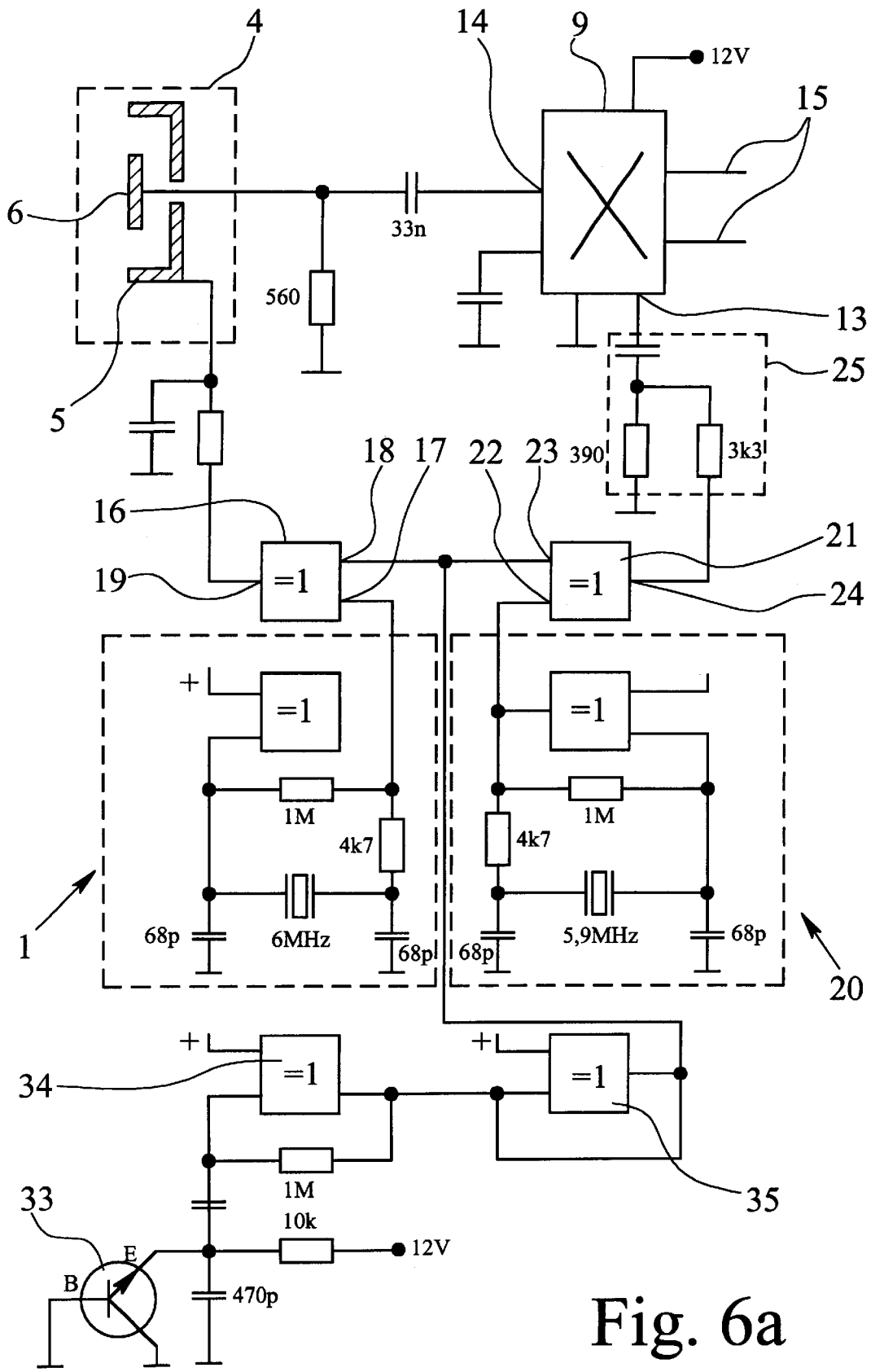
FIGS. 6a and 6b show a preferred embodiment of part of a circuit as claimed in the invention.
Figure 6B:
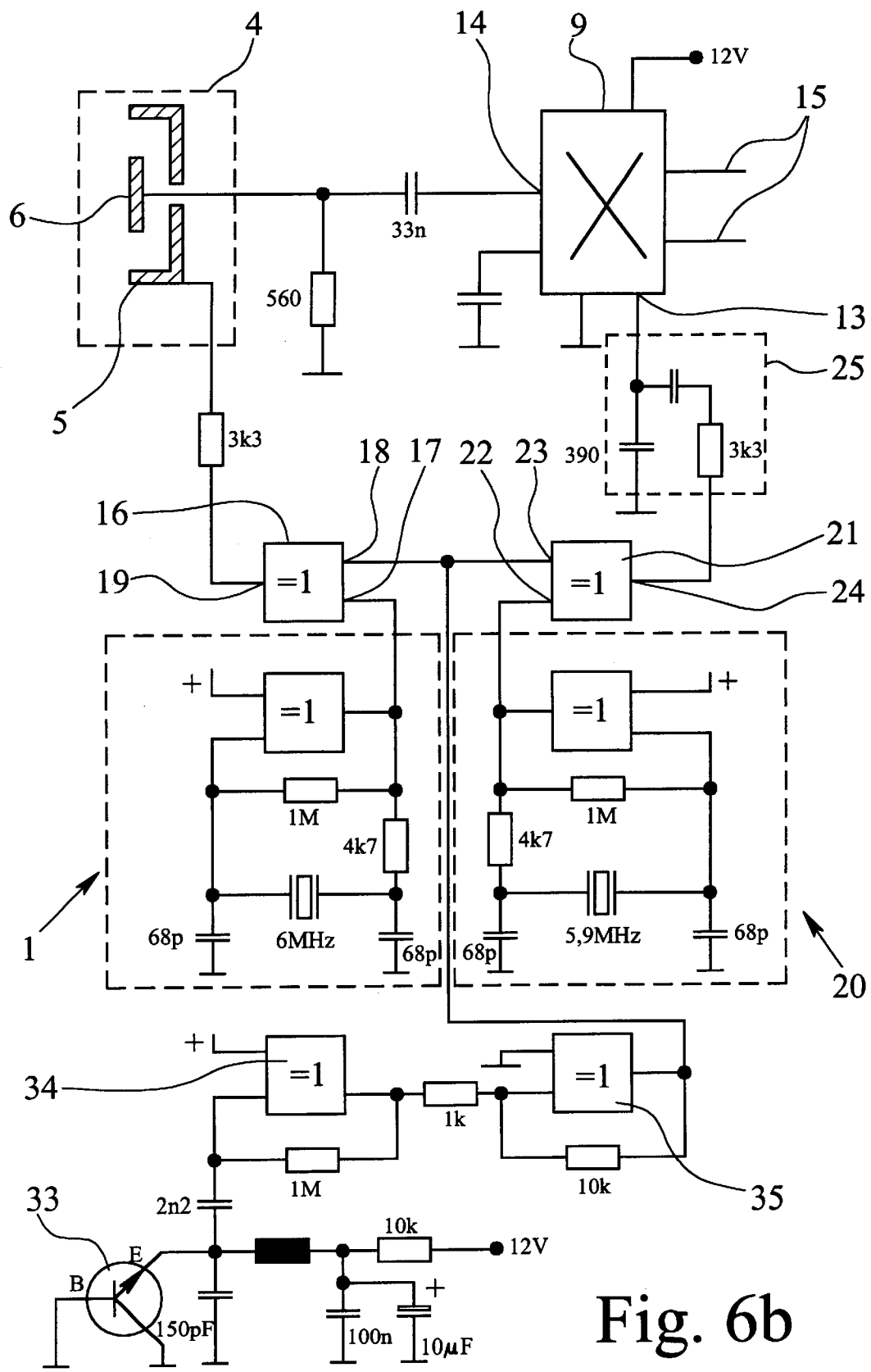
Figure 7:
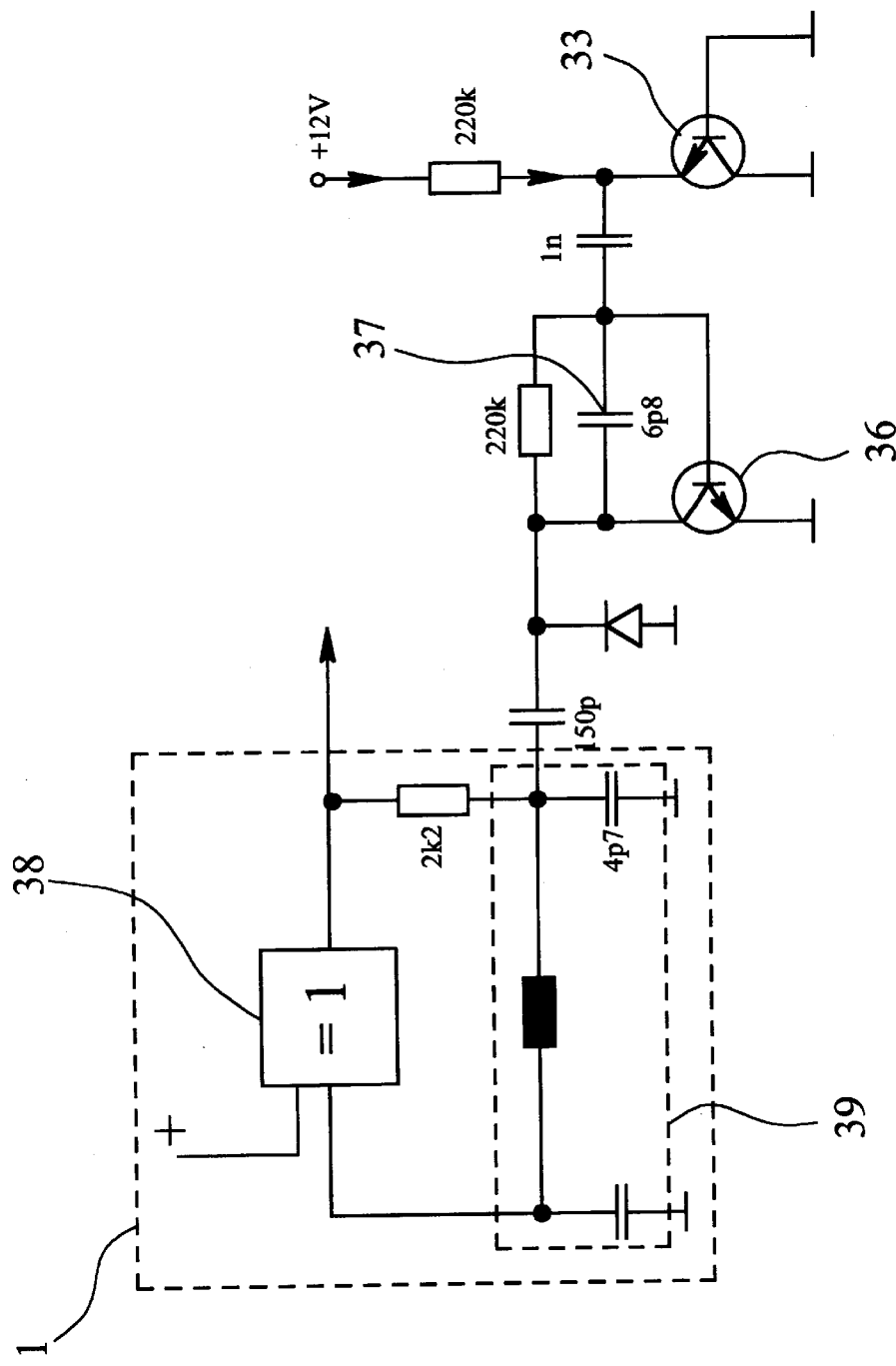
FIG. 7 shows another preferred embodiment of part of a circuit as claimed in the invention.
Figure 8A:
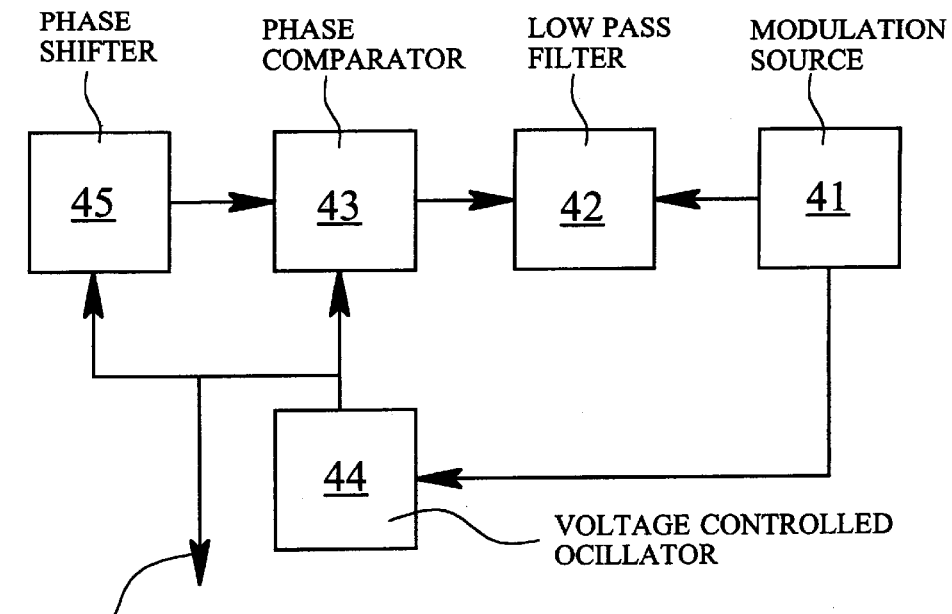
FIGS. 8a, 8b and 8c show again a preferred embodiment of part of a circuit as claimed in the invention.
Figure 8B:
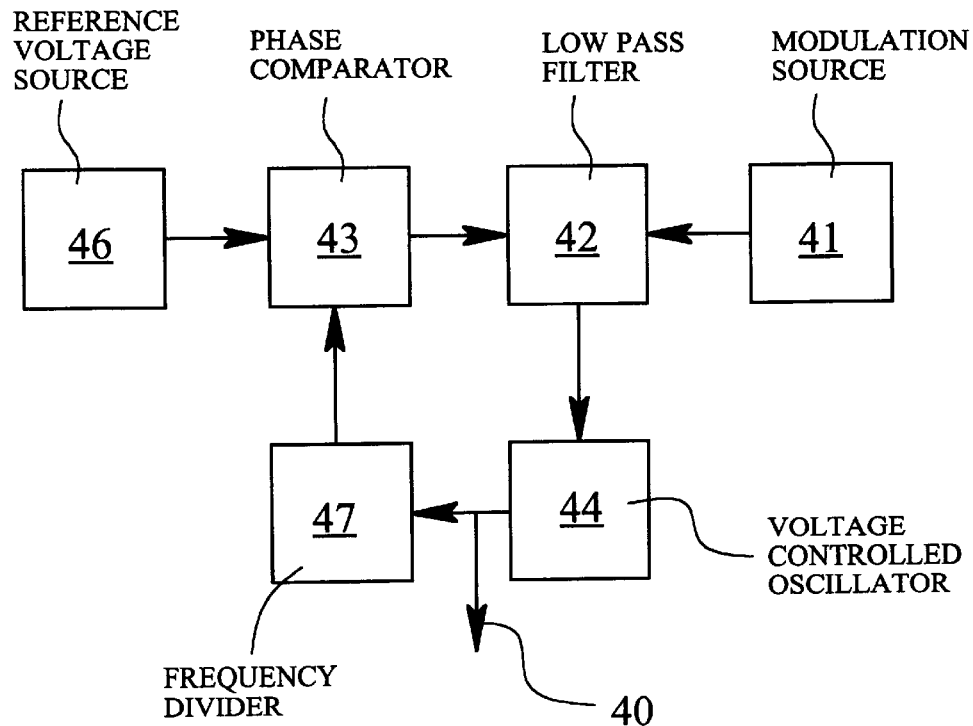
Figure 8C:
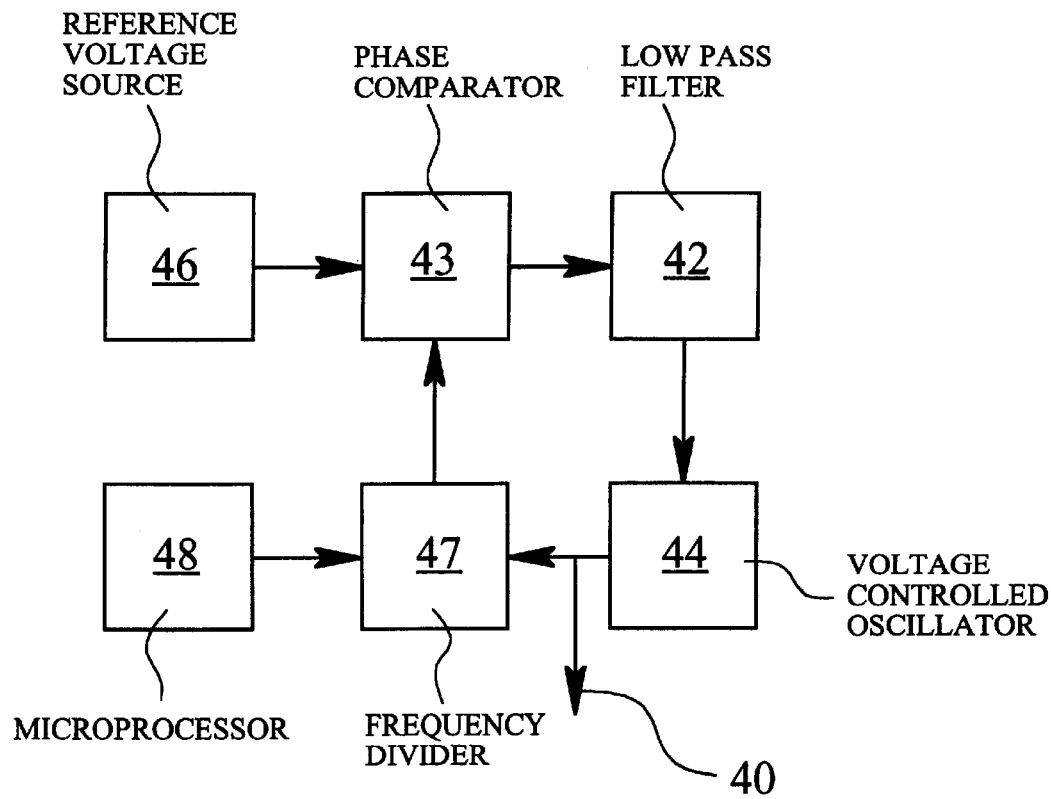

Finally, FIGS. 6a, 6b, 7, 8a, 8b and 8c show specific examples of the circuit as claimed in the invention, however not the entire circuit belonging to the switch being shown. FIGS. 6a, 6b, 7 do not show the evaluation circuit 3 since a circuit as claimed in the invention does contain an evaluation circuit 3, the essence of the invention however not relating to the evaluation circuit 3. FIGS. 8a, 8b, and 8c show only embodiments for the input parts of the circuit as claimed in the invention.

The circuit as shown in FIG. 6a consists of a first oscillator 1 with a frequency of 6 MHz and a second oscillator 20 with a frequency of 5.9 MHz. In addition, the circuit has a sensor 4, a first inverter 16 and second inverter 21, and a correlator 9. The emitter diode of a transistor 33 in breakdown operation is used as the noise source. The advantage of an emitter diode as the noise source lies in a very low power consumption of roughly 14 $\mu$A and the low costs for a normal transistor. For breakdown operation of the transistor 33 a voltage of roughly 9 V is necessary which is ensured by application of the transistor 33 to the operating voltage of 12 V. Parallel to the base-emitter segment of the transistor 33 there is a capacitor by which overly high frequency noise signal components are short circuited.

The noise signal delivered by the transistor 33 is supplied to an analog amplifier 34 followed by a Schmitt trigger 35. The Schmitt trigger 35 guarantees that there are no intermediate values at the inputs 18 and 23 of the two inverters 16 and 21, but only a random binary signal derived from the noise source. The measurement signal of the oscillator I or the auxiliary signal of the oscillator 20 is sent to the two other inputs 17 and 22 of the inverter 16 and 21.

The output 19 of the inverter 16 is connected to the sending electrode 5 of the sensor 4 via a resistor. The measurement electrode 6 is connected via a RC element to the second input 14 of the correlator 9. The output 24 of the second inverter 21 is connected via a matching network 25 which consists of two capacitors and one resistor to the first input 13 of the correlator 9. Thus there is a DC voltage signal with an intermediate frequency of 100 kHz at the output 15 of the correlator 9.

Advantageously EX-OR gates are used as inverters 16 and 21, in particular HCMOS multiple gate ICs being especially well suited, since these gates can also be used as oscillator components so that the two inverters 16, 21 and the two oscillators 1, 20 can be housed on one IC 74 HC 86 with four gates.

The circuit as shown in FIG. 6b corresponds essentially to the circuit as shown in FIG. 6a. It differs from the circuit shown in FIG. 6a on the one hand with respect to the implementation of the noise source, on the other hand with respect to the formation of the transmission paths which follow the outputs 19 or 24 of the inverters 16 and 21.

In the embodiment shown in FIG. 6b the noise source works on a LC tuned circuit which is excited by the noise source to oscillate. In this way with reference to the noise signal a defined bandwidth or an defined center frequency are accomplished.

For the embodiment as shown in FIG. 6b it furthermore applies that the transmission paths which follow the outputs 19 and 24 of the inverters 16 and 21 correspond to one another. The output 19 of the inverter 16 is connected via a resistor to the sending electrode 5 of the sensor 4. The measurement electrode 6 is connected via a RC element to the second input 14 of the correlator 9. The output 24 of the second inverter 21 is connected via a matching network 25 which consists of two capacitors and one resistor to the first input 13 of the correlator 9. The transmission path which follows the output 19 of the inverter 16 includes capacitances which are not discretely implemented, but present anyway, on the one hand between the sending electrode 5 and the measurement electrode 6 and on the other hand between the measurement electrode 6 and the ground. If the ratio of capacitances of the two capacitors which belong to the matching network 25 corresponds to the ratio of the two aforementioned capacitances which are active in conjunction with the sending electrode 5 and the measurement electrode 6, the aforementioned applies that specifically the transmission paths which follow the output 19 of the inverter 16 on the one hand and the output 24 of the inverter 21 on the other correspond to one another.

FIG. 7 shows a circuit in which the frequency spreading of the measurement signal is not, as shown in FIGS. 2 to 6, implemented by phase shift keying of the measurement signal in an inverter, but by frequency modulation of the measurement signal with the noise signal. Here as well the emitter diode of a transistor 33 in breakdown operation is used as the noise source. A second transistor 36 is used here as the noise source operating as a varicap diode. Operation of the transistor 36 corresponds to that of a reactance tube in which the Miller capacitance 37 is multiplied by the controllable gain of the transistor 36. The transistor 33 and the transistor 36 are interconnected via a highpass filter. An inverter 38 made preferably as an analog multiplexer and a LC-π filter 39 are used as the oscillator 1. One such oscillator has the advantage that it can be modulated very effectively, in contrast to a crystal oscillator, for example. The measurement signal frequency modulated in this way is sent via a rectifier to the sending electrode of the sensor.

The above described circuit requires only very few parts, in particular does not require a second oscillator, thus it can be cost-favorably produced and due to use of the emitter diode of the transistor 33 as the noise source has only very low power consumption. The low noise power of the emitter diode causes a very low frequency deviation of the fundamental wave during frequency modulation, since however the harmonic frequencies of the measurement signal are much more critical with respect to noise emission and the frequency deviation is multipled by the ordinal number of the harmonics, at the critical harmonics the frequency deviation is relatively large. One such circuit is especially suitable for dynamically operating 2-lead proximity switches.

To explain what is shown in FIGS. 8a, 8b and 8c, the connection should be made to the embodiment of a circuit as claimed in the invention shown in FIG. 4. Here then the respective output 40 of the parts of a circuit as claimed in the invention which are shown in FIGS. 8a, 8b and 8c is comparable to the output 19 of the inverter 16 in the circuit as shown in FIG. 4. The output 40 of the parts of a circuit which are shown in FIGS. 8a, 8b and 8c can therefore, as shown for the output 19 of the inverter 16 in FIG. 4, be connected to the inputs 13 and 14 of the second correlator 9 via the corresponding transmission paths as shown in FIG. 4 as the matching network 25 and as the sensor 4.

In the embodiments shown in FIGS. 8a and 8b there are one modulation source 41, one lowpass filter 42, one phase comparator 43 and one voltage controlled oscillator 44 (VCO) each. In the embodiment shown in FIG. 8a there is a frequency-dependent phase shifter 45 while in the embodiment as shown in FIG. 8b there are another low frequency reference voltage source 46 and a programmable frequency divider 47.

It applies to the embodiment shown in FIG. 8c that here are also a lowpass filter 42, a phase comparator 43, a voltage-controlled oscillator 44, a low frequency reference voltage source 46 and a programmable frequency divider 47. In addition, the embodiment shown in FIG. 8c includes a microprocessor 48. The programmable frequency divider 47 in conjunction with the microprocessor 48 which delivers a random sequence leads to the desired noise modulation.

It applies to the embodiments shown in FIGS. 8a, 8b and 8c that frequency modulation of the measurement signal takes place using a phase locked loop (PLL) as the clock generator.

The invention has been described above solely in conjunction with capacitive switches. It can however be easily applied to other electronic devices which on the one hand emit electromagnetic radiation and signals into the environment and on the other hand are sensitive to reception of electromagnetic radiation and signals from the environment. These electronic devices are for example, but not exclusively, also inductive and optoelectronic switches.

What is claimed is:

1. Process for operating a capacitive switch, the switch having an oscillator which delivers a measurement signal, a capacitive sensor consisting of at least one sending electrode and one measurement electrode, and an evaluation circuit, comprising the steps of:

frequency-spreading the measurement signal by a noise signal delivered by a noise source, emitting the frequency-spread measurement signal by the sending electrode of the capacitive sensor, sending the frequency-spread measurement signal to a first input of a correlator, sending a receive signal picked up by the measurement electrode of the sensor to the second input of the correlator, and sending an output signal of the correlator to the evaluation circuit.

2. Process for operating a capacitive switch, the switch having an oscillator which delivers a measurement signal, a capacitive sensor comprising at least one sending electrode and one measurement electrode, and an evaluation circuit, comprising the steps of:

generating, by a second oscillator, an auxiliary signal which has the same or a slightly different frequency from the measurement signal, frequency-spreading the measurement signal and the auxiliary signal by a noise signal delivered by the noise source, emitting the frequency-spread measurement signal by the sending electrode of the capacitive sensor, sending the frequency spread auxiliary signal to the first input of a correlator, picking up the received signal by the measurement electrode of the sensor sending the received signal to the second input of the correlator, and sending the output signal of the correlator to the evaluation circuit.

3. Process as claimed in claim 1, further comprising the step of:

producing the frequency spreading of the measurement signal or the auxiliary signal by frequency modulation of the measurement signal or the auxiliary signal with the noise signal.

4. Process as claimed in claim 3, wherein frequency modulation of the measurement signal or auxiliary signal takes place by a transistor which is used at the same time as a noise amplifier, or using a phase locked loop (PLL) as a clock generator.

5. Process as claimed in claim 1, further comprising the step of:

producing the frequency spreading of the measurement signal or the auxiliary signal by phase shift keying the measurement signal or the auxiliary signal.

6. Process as claimed in claim 5, wherein frequency spreading of the measurement signal or the auxiliary signal takes place using a binary random signal obtained from the noise signal by 0/180° phase shift keying.

7. Process as claimed in claim 6, wherein phase shift keying takes place by means of an inverter, said inverter comprising an EX-OR gate or a ring mixer.

8. Process as claimed in claim 1, wherein an emitter diode of a transistor in breakdown operation is used as the noise source.

9. Process as claimed in claim 1 to 7 wherein a digital noise source with a pseudorandom sequence with a finite period length is used as the noise source.

10. Circuit of a capacitive switch, comprising:

an oscillator delivering a measurement signal;

a gauge length having at least one sensor with a sending electrode and a measurement electrode;

an evaluation circuit, a noise source; and first and second correlators, wherein frequency spreading of the measurement signal takes place in the first correlator by modulating the measurement signal and the noise source, wherein an output from the first correlator comprising the frequency-spread measurement signal is connected to a first input of the second correlator and to the sending electrode, and wherein the measurement electrode is connected to a second input of the second correlator.

11. Circuit as claimed in claim 21, wherein the noise source comprises an emitter diode of a transistor in breakdown operation.

12. Circuit as claimed in claim 10, wherein the first correlator comprises a transistor that is used as a noise amplifier and frequency modulator for modulating the measurement signal with the noise signal.

13. Circuit as claimed in claim 10, wherein the first correlator comprises an inverter, wherein the first input of the inverter is connected to receive the measurement signal, and the second input of the inverter is connected to the noise source, and wherein the output of the inverter is connected to the first input of the second correlator and to the sending electrode.

14. Circuit as claimed in claim 13, further comprising:

a second oscillator which produces an auxiliary signals, and a second inverter, wherein a first input of the second inverter is connected to the the output of the second oscillator and the second input of the second inverter is connected to the noise source, and wherein the output of the first inverter is connected to the sending electrode and the output of the second inverter is connected to the first input of the second correlator.

15. Circuit as claimed in claim 14, further comprising a matching network connected between the output of the second inverter and the first input of the second correlator.

16. Circuit as claimed in claim 13, wherein the inverter is an EX-OR gate.

17. Circuit as claimed in claim 14, wherein both the oscillators and the inverters are integrated in an IC.

18. Circuit as claimed in claim 10, wherein the evaluation circuit comprises a filter, an amplifier and a voltage comparator.

19. Circuit as claimed in claim 10, wherein the oscillator comprises an LC oscillator.

20. Circuit as claimed in claim 10 wherein the second correlator is a multiplier, relay or polarity correlator.

* * * * *